United States Patent [19]

Shimada et al.

[11] 4,393,472
[45] Jul. 12, 1983

[54] SEMICONDUCTOR MEMORY CIRCUIT

[75] Inventors: Hiroshi Shimada, Tokyo; Keizo Aoyama, Yamato, both of Japan

[73] Assignee: Fujitsu Limited, Kawasaki, Japan

[21] Appl. No.: 217,803

[22] Filed: Dec. 18, 1980

[30] Foreign Application Priority Data

Dec. 27, 1979 [JP] Japan .................................. 54-169187

[51] Int. Cl.³ ........................ G11C 7/00; G11C 11/40
[52] U.S. Cl. ..................................... 365/190; 365/230
[58] Field of Search ............... 365/205, 203, 189, 230, 365/190

[56] References Cited

U.S. PATENT DOCUMENTS 4,074,237 2/1978 Spampinato ....................... 365/189
4,290,120 9/1981 Stein .................................... 365/205

FOREIGN PATENT DOCUMENTS 52-35951 3/1977 Japan .................................. 365/205

OTHER PUBLICATIONS

Arzubi, "Sense Amplifier For Capacitive Storage", IBM Tech. Disc. Bul., vol. 19, No. 2, 7/76, pp. 407–408.

Primary Examiner—Stuart N. Hecker
Attorney, Agent, or Firm—Staas & Halsey

[57] ABSTRACT

A semiconductor memory circuit is provided with a right memory cell group and a left memory cell group, word decoders corresponding to respective rows and; which are located between the right and left memory cell groups and which specify an address in the word direction of these memory cell groups, and column decoders corresponding to respective column which specify an address in the bit direction of these memory cell groups. The memory circuit also includes right and left memory cell group selection and drive gates for every word decoder and circuits for detecting whether the accessed memory cell is in the right or left memory cell group. The right or left memory cell group selection and drive gates operate in a complimentary manner and in accordance with the accessed memory cell being in the right or left memory cell group.

6 Claims, 3 Drawing Figures

SEMICONDUCTOR MEMORY CIRCUIT

BACKGROUND OF THE INVENTION

1. Field of the Invention

This invention relates to a semiconductor memory circuit, and more particularly to a static type semiconductor memory circuit.

2. Description of the Prior Art

A semiconductor memory circuit, for example, a static type semiconductor member circuit, basically comprises many memory cells for storing data, word decoders which specify the address of the memory cells arranged in the form of a matrix from the word direction and column decoders which specify the address of the memory cells from the column direction. These word decoders and column decoders are respectively arranged along one side in the vertical direction and one side in the lateral direction of the memory cells, and can read the data stored in the one memory cell specified by the word and column decoders. In practice, the memory cells are divided into two groups, the right memory cell group and the left memory cell group and the word decoders are arranged at the center of the right and left memory cell groups. This arrangement is desirable because if the word decoders were arranged along the vertical direction, the voltage drop between the ends of the polysilicon electrodes extending in the lateral direction becomes very large. Therefore, the word decoders are located at the center of the right and left memory cell groups in order to reduce the voltage drop to a half, and distribute equally the voltage drop to the right and left memory cell groups, thereby improving the memory function.

However, the abovementioned semiconductor memory circuit is inevitably accompanied by disadvantages. The first disadvantage is a high power consumption, and the second disadvantage is that output operation speed cannot be made so high in relation to such high power consumption. This disadvantage results from the following. Namely, a bit current flows to all memory cells storing logic 0 data "L" in the memory cell group selected by the word decoder due to the structure of semiconductor memory circuit regardless of whether the relevant memory cells are also selected in the bit direction or not. Therefore, when the bit current can be reduced by at least a half, it is a considerable step in solving such disadvantage.

SUMMARY OF THE INVENTION

It is an object of the present invention to provide a semiconductor memory circuit with reduced bit current and reduced power consumption.

It is another object of the present invention to provide semiconductor memory circuit which can reduce a power consumption by adding a simple construction. It is a further object of the present invention to provide a semiconductor memory circuit having a highspeed output operation.

In order to attain such objects, the present invention provides a discrimination means which determines whether the specified memory cell is in the right or left memory cell group, and right and left memory cell group drive gates for each word decoder. Further, the right and left memory cell group drive gates are closed one by one in accordance with the result of the discrimination by the discrimination means.

DESCRIPTION OF THE PREFERRED EMBODIMENT

Figure 1:
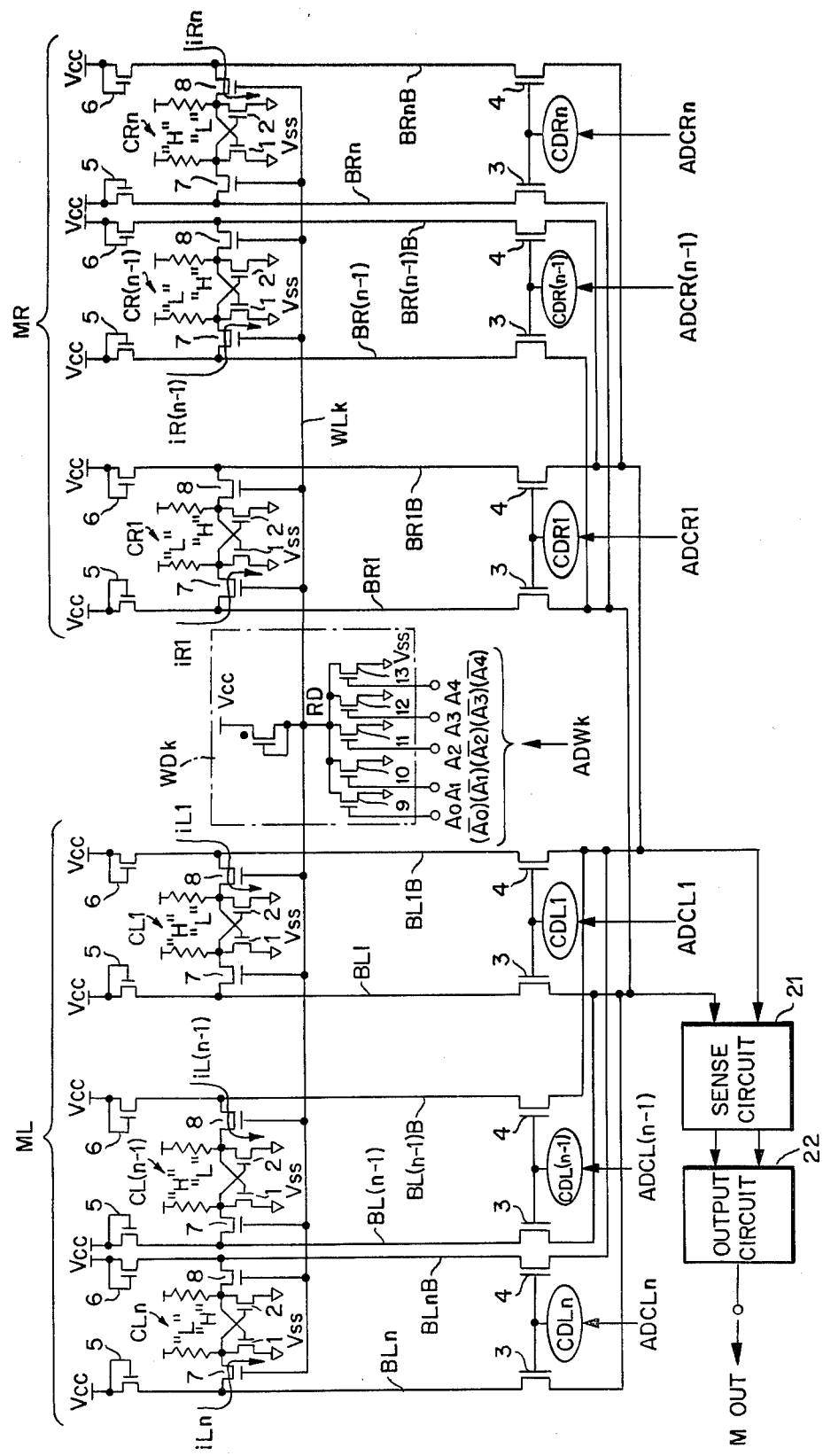
FIG. 1 is a schematic circuit diagram illustrating the structure and operation of a general semiconductor memory circuit.

FIG. 1 is a schematic diagram illustrating the structure and operation of a general semiconductor memory circuit. In this figure, ML is the left memory cell group and MR is the right memory cell group, thus the word decoders are provided between the groups for corresponding rows. However, in this figure, only the word decoder WDk of the kth row is indicated. The word decoder WDk drives the full length of the word line WLk.

When considering the left memory cell group ML, the n memory cells CL1 to CLn are connected along the word line WLk and each of the memory cells comprises a pair of FETs (1, 2) which operate in the complementary mode and a pair of transfer FETs (7, 8). To each pair of FETs (1, 2), the bit lines (BL1, BL1B) to (BLn, BLnB) are connected via transfer FETs (7, 8). The bit lines (BL1, BL1B) to (BLn, BLnB) respectively output the complementary logical bit data of the respective memory cells. The bit data is applied to a pair of FETs (3, 4) connected to each of the column decoders CDL1 to CDLn, then to the sense circuit 21 via the wired ORed FETs (3, 4) associated with the column decoders CDL1 to CDLn, and finally output as the memory output $M_{out}$ via the output circuit 22. The FETs (5, 6) in each of the bit lines BL1B, BL1 ... BLnB, BLn are load FETs.

The abovementioned structure is applied analogously to the right memory cell group MR, where CDR1 to CDRn are column decoders, BR1, BR1B ... BRn, BRnB are bit lines, CR1 to CRn are memory cells.

If the address is specified for the memory cell CL1 (memory cell connected to the first bit lines (BL1, BL1B) within the left memory cell group ML), the word decoder WDk associated with the memory cell CL1 is specified by the word address ADWk.

The word address ADWk consists of address bits $A_0$ (or $\overline{A_0}$), $A_1$ (or $\overline{A_1}$), $A_2$ (or $\overline{A_2}$), $A_3$ (or $\overline{A_3}$) and $A_4$ (or $\overline{A_4}$) when the number of memory cells in the column direction is 32.

When the word decoder WDk is specified by the word address ADWk, all of the FETs (9, 10, 11, 12 and 13) comprising the word decoder WDk are turned OFF and therefore word line WLk becomes a high, "H" level so that the transfer FETs (7, 8) of the corresponding memory cells are turned ON. Thereby, the bit current iL1 to iLn and iR1 to iRn flows through each FET storing the logic low data "L" among pair of FETs (1, 2) of the memory cells CL1 to CLn and CR1 to CRn associated with the word line WLk, from the power supply $V_{cc}$ to the power supply $V_{ss}$. Then, the column decoder CDL1 corresponding to the relevant memory cell CL1 and is designated by the column address ADCL1, and the data stored in the memory cell CL1 is output through the sense circuit 21 and output circuit 22 via the bit lines (BL1, BL1B). The column address ADCL, comprises address bits $A_5$(or $\overline{A_5}$), $A_6$(or $\overline{A_6}$), $A_7$(or $\overline{A_7}$), $A_8$(or $\overline{A_8}$) and $A_9$(or $\overline{A_9}$) when the number of memory cells in the word direction is 32.

When focusing on the bit current, even while the address is specified only for the memory cell CL1, unwanted and useless bit current also flows into all memory cells other than said memory cell.

The total excess bit current becomes very large as high as indicated by the following equation.

$$\sum_{r=1}^{n} iLr + \sum_{r=1}^{n} iRr - iL1$$

This fact means that the power consumption becomes high and high speed operation is considerably restricted because all memory cells must be deiven at the same time.

Figure 2:
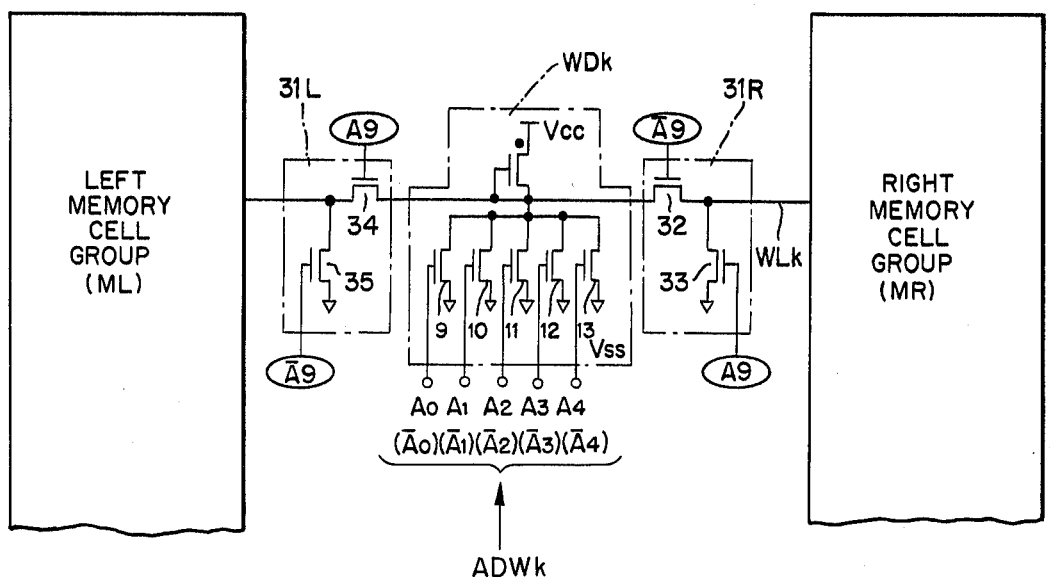
FIG. 2 is a schematic circuit diagram illustrating an embodiment of the present invention.

Therefore, in the present invention, additional circuits are connected to each word decoder to reduce the total amount of bit current by a half. FIG. 2 shows an embodiment of the present invention. In this figure, the left memory cell group (ML) drive gate 31L and the right memory cell group (MR) drive 31R are provided in the left and right sides of each word decoder. Also only one of the right and left memory cell group drive gates 31R and 31L is conductive at a time.

The gates 31R and 31L each receive the lowest (last) column address bit $A_9$ and its complementary bit $\overline{A_9}$, for example, which indicates whether the memory cell to be accessed is located in the right or left memory cell groups (MR or ML). According to the above example, since the memory cell CL1 of the left memory cell group ML is designated, the address bit $A_9$ is a logic "1" i.e. "H" level. Thus, the left memory cell group drive gate 31L is turned on and simultaneously the right memory cell group drive gate 31R is turned off. Thus the right side of the word line WLk is not driven and the current indicated by $$\sum_{r=1}^{n} iRr$$

of the above equation becomes zero. On the contrary, if a memory cell in the right memory cell group MR is accessed, the address bit $A_9$ is logic "0" i.e. "L" level and the right memory cell group drive gate 31 R is turned on and simultaneously the left memory cell group drive gate 31L is turned off. Therefore, the left part of the word line WLk is not driven and thus the current indicated by $$\sum_{r=1}^{n} iLr$$

of the above equation, becomes zero. Thus, the power consumption specified by the total bit current of the above equation becomes almost one-half of the power consumption for the conventional device.

The right and left memory cell group drive gates 31R and 31L respectively comprise transistors (32, 33) and transistors (34, 35). The transistors 32 and the transistor 34 are inserted in series with the word line but the transistor 34 and the transistor 35 are connected in parallel between the word line and the power supply $V_{ss}$. In principle, the desired gate function can be obtained with only the transistor 32 and the transistor 34, but it is desirable to hold the corresponding right or left word line forcibly at the specified potential ($V_{ss}$) by means of the transistor 33 or 35 which turns ON simultaneously with the transistors 34 or 32 when they turn ON. Thus preventing the right or left word line from floating, resulting in errorneous operation when the transistor 32 or 34 turns OFF. Namely, the transistors 32 and 33 turn ON or OFF complementarily and the transistors 34 and 35 also turn ON or OFF complementarily. In addition, the transistors 32 and 34 must turn ON or OFF alternatively and therefore they require the signals; $A_9$ and $\overline{A_9}$ as the signals. According to the above example, in case the memory cell CL1 is specified, the transistor 34 turns ON because $A_9$="H" and the transistor 35 turns OFF because $\overline{A_9}$="L". On the other hand, the transistor 32 turns OFF because $\overline{A_9}$="L" and the transistor 33 turns ON because $A_9$="H". In this case, the memory cells in the right side can be put into the not-selected condition without being placed in the floating mode.

Figure 3:
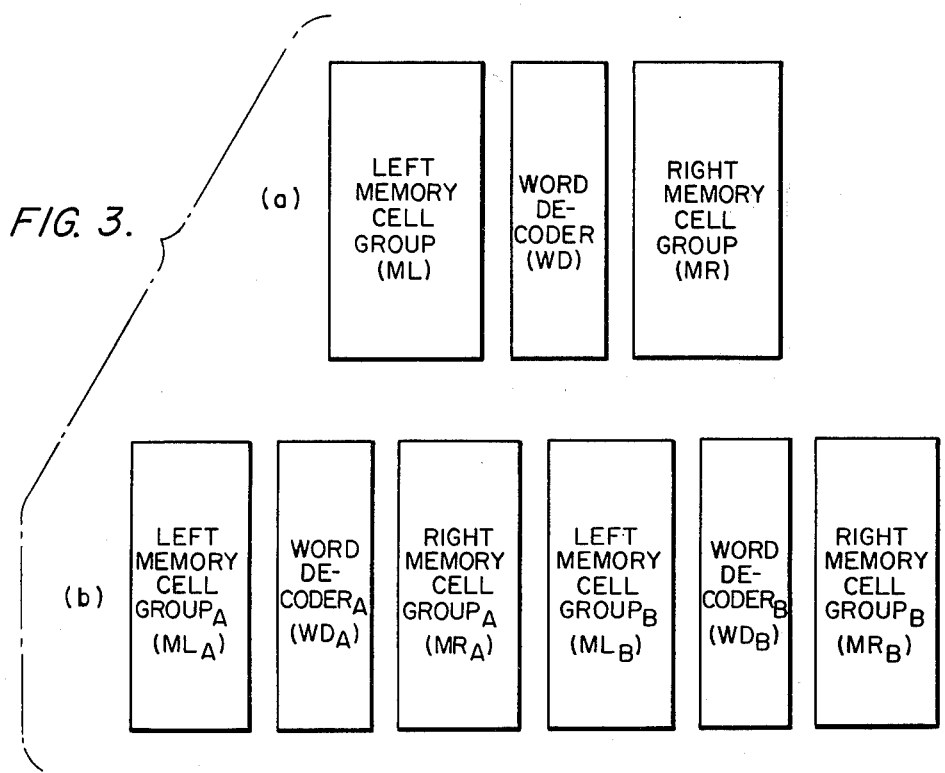
FIG. 3, including (a) and (b), is a diagram showing the arrangement pattern of word decoders and memory cell groups to which present invention can be applied.

FIG. 3 shows examples of an arrangement pattern of word decoders and memory cell groups in which the present invention can be applied.

FIG. 3(a) shows the arrangement pattern corresponding to FIG. 1.

FIG. 3(b) shows the arrangement pattern in which two word decorders ($WD_A$, $WD_B$) are provided between the first right memory cell group $MR_A$ and the first left memory cell group $ML_A$, and the second right memory cell group $MR_B$ and the second left memory cell group $ML_B$, respectively.

As explained above, the present invention realizes a semiconductor memory circuit which has reduced the power consumption to almost ½ that of conventional devices, and which is also suitable for a high speed operation.

It will be obvious that the present invention is not restricted to the above-mentioned embodiment, and that many variations are possible for those skilled in the art without departing from the scope of the present invention.

What is claimed is:

1. A semiconductor memory circuit comprising:
   a right memory cell group and a left memory cell group, each having a plurality of rows and columns corresponding to word lines and bit lines, respectively;
   a plurality of word decoders respectively connected to corresponding ones of said rows, said word decoders being connected between the right and left memory cell groups and receiving row address signals specifying a word line within the memory cell group to be selected; and
   a plurality of column decoders correspondingly connected to respective ones of said columns for receiving column address signals specifying the bit within the memory cell group to be selected;
   a plurality of right memory cell group selection and drive gates operatively connected between respective ones of said word decoders and respective ones of said rows connected to said right memory cell group;
   a plurality of left memory cell group selection and drive gates operatively connected between respective ones of said word decoders and respective ones of said rows connected to said left memory cell group; and
   discriminating means for discriminating whether the memory cell to be selected is located in the right or left memory cell group, for providing an output responsive to said discriminating means, and for controlling the right and left memory cell group selection and drive gates in accordance with the output of said discriminating means.

2. A semiconductor memory circuit according to claim 1, wherein the discriminating output corresponds to a specified column address signal.

3. A semiconductor memory circuit according to claim 1, wherein each of the plurality of right and the plurality of left memory cell group selection and drive gates comprises a series transistor connected in series with said respective ones of said word lines.

4. A semiconductor memory circuit according to claim 3, further comprising a transistor for preventing a floating condition of said respective ones of said word lines connected in parallel with said series transistor.

5. A semiconductor memory circuit according to claim 1, wherein said word decoders are located between the right and left memory cell groups.

6. A semiconductor memory circuit according to claim 1, wherein said memory cell groups comprise flip-flop memory cells.

* * * * *

UNITED STATES PATENT AND TRADEMARK OFFICE
CERTIFICATE OF CORRECTION

PATENT NO. : 4,393,472
DATED : July 12, 1983
INVENTOR(S) : Shimada et al.

It is certified that error appears in the above-identified patent and that said Letters Patent is hereby corrected as shown below:

Front page, [57] ABSTRACT, line 3, delete ";";
    line 14, "complimentary" should be --complementary--.
Column 1, line 56, delete "a";
    line 60, "low" should be --"low"--;

Column 3, line 16, "deiven" should be --driven--;
    line 31, "groups" should be --group--;
    line 62, "transistors" should be --transistor--;
Column 4, line 10, delete ";";
    line 10, "Aq" (second occurrence) should be --$\overline{Aq}$--;

Signed and Sealed this

Twenty-ninth Day of November 1983

[SEAL]

Attest:

GERALD J. MOSSINGHOFF

Attesting Officer     Commissioner of Patents and Trademarks